United States Patent
Yuan et al.

(10) Patent No.: US 8,279,741 B2
(45) Date of Patent: Oct. 2, 2012

(54) DEVICE AND METHOD FOR INTERLEAVED ENCODING RS CODE

(75) Inventors: Zhifeng Yuan, Shenzhen (CN); Jun Xu, Shenzhen (CN); Song Li, Shenzhen (CN); Xiangbiao Yan, Shenzhen (CN); Yuanli Fang, Shenzhen (CN); Jin Xu, Shenzhen (CN); Liujun Hu, Shenzhen (CN)

(73) Assignee: ZTE Corporation, Shenzhen (CN)

( * ) Notice: Subject to any disclaimer, the term of this patent is extended or adjusted under 35 U.S.C. 154(b) by 336 days.

(21) Appl. No.: 12/677,260

(22) PCT Filed: May 4, 2008

(86) PCT No.: PCT/CN2008/070868
§ 371 (c)(1),
(2), (4) Date: Mar. 9, 2010

(87) PCT Pub. No.: WO2009/076801
PCT Pub. Date: Jun. 25, 2009

(65) Prior Publication Data
US 2011/0007661 A1   Jan. 13, 2011

(30) Foreign Application Priority Data
Dec. 14, 2007  (CN) .......................... 2007 1 0195762

(51) Int. Cl.
*H04J 9/00* (2006.01)
*H03M 13/00* (2006.01)

(52) U.S. Cl. ........................... 370/204; 714/784; 386/85

(58) Field of Classification Search .................. 370/204, 370/280, 326, 329, 338, 431; 714/784; 386/85
See application file for complete search history.

(56) References Cited

U.S. PATENT DOCUMENTS

| | | | | |
|---|---|---|---|---|
| 5,517,509 A | * | 5/1996 | Yoneda | 714/785 |
| 2002/0152443 A1 | | 10/2002 | Oh | |
| 2006/0156206 A1 | * | 7/2006 | Shen et al. | 714/784 |
| 2007/0162834 A1 | | 7/2007 | Banerjee | |
| 2010/0061698 A1 | * | 3/2010 | Morello et al. | 386/85 |

FOREIGN PATENT DOCUMENTS

| | | |
|---|---|---|
| CN | 1787385 A | 6/2006 |
| CN | 1838297 A | 9/2006 |
| CN | 101065910 A | 10/2007 |

OTHER PUBLICATIONS

Burst-Correcting Codes for the Classic Bursty Channel.
(Continued)

*Primary Examiner* — Jianye Wu
*Assistant Examiner* — Wanda Z Russell
(74) *Attorney, Agent, or Firm* — Oppedahl Patent Law Firm LLC (57) ABSTRACT

The present invention provides a device and method for interleaved encoding RS code, the RS code used being RS (N, K, S). The method comprises: firstly, writing the data in the data packets to be RS interleaved encoded into the information region of the RS code byte interleaver column-by-column in turn; then, constructing the data of each row of the check region based on the data written into the information region; finally, performing cyclic shifting processing on the data of the check region, and reading out the data of the check region in the RS code byte interleaver column-by-column in turn. The present invention can be used to improve the performance of the entire data packet outputted, thereby enhancing the reliability of the data link layer, by evenly spreading the areas with a filled value of 0 in the last column of the information region that is filled with valid information and by performing cyclic shifting processing on the data of the check region so that the data of that region offer larger time span and good diversity effect when outputted.

13 Claims, 3 Drawing Sheets

OTHER PUBLICATIONS

Realization of Optimum Interleavers.
Supplementary European Search Report in european application No. 08734224.2, mailed Nov. 15, 2010.
Interleaver Properties and Their Applications to the Trellis Complexity Analysis of Turbo Codes.

English translation of the written opinion of the international search authority in international application No. PCT/CN2008/070868, mailed Sep. 18, 2008.
International Search Report in international application No. PCT/CN2008/070868, mailed Sep. 18, 2008.

* cited by examiner

The present invention generally relates to the field of wireless communications, and more specifically relates to a device and method for interleaved encoding RS code in a wireless communication system.

DEVICE AND METHOD FOR INTERLEAVED ENCODING RS CODE

TECHNICAL FIELD

The present invention generally relates to the field of wireless communications, and more specifically relates to a device and method for interleaved encoding RS code in a wireless communication system.

BACKGROUND

Linear Block Code is a fixed-length code block, which may be expressed as (n, k), and generally be used for forward error correction. During encoding, k information bits may be encoded into an n-bit code block length. Because $2^k$ code words of the block code [n, k, d] form a k-dimension subspace, wherein d is the minimal code distance, then the $2^k$ code words can definitely be generated by k linearly independent bases; if the k bases are written in the form of a matrix, then $$G = \begin{bmatrix} g_{1,n-1} & g_{1,n-2} & \cdots & g_{1,0} \\ g_{2,n-1} & g_{2,n-2} & \cdots & g_{2,0} \\ \vdots & \vdots & & \vdots \\ g_{k,n-1} & g_{k,n-2} & \cdots & g_{k,0} \end{bmatrix}$$

wherein any code word in the block code [n, k, d] can be generated based on a linear combination of this group of bases, i.e., $$C = m \cdot G[m_1 \ m_2 \ \cdots \ m_{n-k}] \begin{bmatrix} g_{1,n-1} & g_{1,n-2} & \cdots & g_{1,0} \\ g_{2,n-1} & g_{2,n-2} & \cdots & g_{2,0} \\ \vdots & \vdots & & \vdots \\ g_{k,n-1} & g_{k,n-2} & \cdots & g_{k,0} \end{bmatrix}$$

G is called a generated matrix of codes. Obviously, for individual rows in the generated matrix, it would suffice as long as the rows satisfy linear independence (without considering the minimum distance), while a k-dimension basis can arbitrarily choose k linearly independent vectors, therefore the generated matrix G of codes is also not unique; however, no matter which form is adopted, the same subspace, i.e., the same block code [n, k, d] can always be generated.

As a linear block cyclic code, an RS code (Reed-Solomon Code) takes a group of symbols with a length of n (generally n=8 bit, called an coded word) as a processing unit, wherein the n symbols in the group are generated by k information symbols that are to be transmitted according to a certain correlation relation. Since these n symbols should also contain error code protection information, it is required to use (n, k) to express the encoding form while k<n, therefore, when n=8, there are a total of $2^8=256$ symbols, and the range of the symbols expressed in decimal form is 0-255. These 256 symbols constitute a finite field (called the Galois Field) $GF(2^8)$. In general, the finite field is expressed by $GF(2^m)$ when it is an extension field of a binary field GF(2). In the $GF(2^m)$ field, for an RS code (n, k) that can correct t errors, the number of check symbols is 2×t, and the minimum code distance is $d_{min}=2\times t+1=n-k+1$ (the check matrix is a non-singular matrix). An error of 1 symbol may mean an error that occurs in 1 bit in the symbol, or an error that occurs in several bits or even all m bits in the symbol. It therefore can be seen that the RS code offers an extremely powerful ability to correct random errors and burst errors, and thus is very broadly applied in the field of digital error control.

A link layer is required to provide a network layer with data transfer service, which is carried out depending on functions equipped with the link layer. The functions equipped with the link layer include: establishment and removal of a data link, frame transmission and frame synchronization, error and flow control, and data link management. As an addition to a forward error correction technology of a physical link layer, Forward Error Correction (FEC) of the link layer is used to implement the function of error control of the link layer and to ensure that the next higher layer protocol can receive an error-free datagram. Given the superior performance, the RS code is very suitable as a Link Layer Forward Error Correction code.

Interleavers commonly used in digital communications may be classified as byte interleavers and bit interleavers according to interleaving objects. The byte interleaver is mainly used to disorganize the original byte sequence to make wrong positions to look like random, and to weaken the correlation of the byte sequence before and after interleaving and to make it distributed among many code words rather than among several code words only. An outstanding advantage of doing so is that the impact of data burst errors is greatly reduced.

Figure 1:
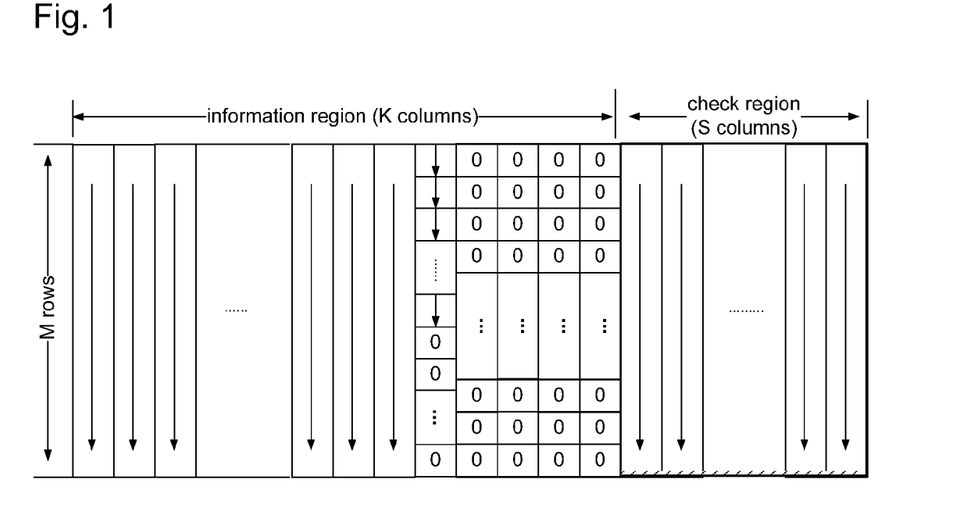
FIG. 1 is an illustration after performing RS code interleaved encoding in an existing technology.

In order to further improve the performance of the link layer FEC, an RS encoder is often used together with the byte interleaver, which acts as an RS code interleaving encoding method (Reed-Solomon Code with Byte Interleaver). In general, a row-column interleaver may be used as the byte interleaver, wherein the number of columns equals the code length of the RS code and the number of rows varies with the number of code blocks. For example, the byte interleaver for the RS (255, 207) code is fixed to have 255 columns, wherein the 207 columns on the left side are an information region and the 48 columns on the right side are a check region. In an existing RS code interleaving encoding method, when a traffic data packet is inputted into the byte interleaver, firstly, the 0th column may be filled in an order from the top down, once the 0th column is filled up, the 1st column may then be filled in an order from the top down, and so on, until all data in the traffic data packet are completely filled into the interleaver, and as to the unfilled portions in the first 207 column, 0 may be filled in. A check value of each row contains 48 bits, and such a check value is generated based on data information of the first 207 bits. The form after interleaved encoding is shown in FIG. 1. When data in the interleaver is outputted, it begins from the 0th column to output data in an order from the top down, upon completion of output of the 0th column, data in the 1st column may then be outputted in an order from the top down, until all data in the 255 columns are completely outputted. Rows or columns of the interleaver may, but are not limited to be numbered from 0, however, in order to maintain consistency of descriptions, the numbering all starts from 0 in the present invention.

The existing RS code interleaving encoding method has the following defects: those portions with the filled value of 0 in the information region are congregated together, this would result in that the continuous time regions corresponding to the latter rows with the filled value of 0 relatively obtain overprotection, while the continuous time regions corresponding to the previous rows get relatively less protection. Even though the data of the check region are generated in a row manner and are read out in a column manner, the interleaving among data during output is too regular to offer the best interleaving effect, therefore the performance of the entire outputted data packet can not be optimal.

SUMMARY

The present invention aims to solve the technical problem by providing a device and method for interleaved encoding RS code, which can remedy defects of low performance of the entire outputted data packet and low reliability of a data link layer in an existing technology caused by high correlation among data of a check region when an interleaved encoded data packet is outputted.

The technical scheme adopted in the present invention is: a method for interleaved encoding RS code, assuming the RS code used being RS (N, K, S), the method including the following steps:

a, sequentially writing data in a data packet to be RS interleaved encoded into an information region of an RS code byte interleaver column-by-column;

b, constructing data of each row of a check region based on the data written into the information region; and c, performing cyclic shifting processing on the data of the check region, and sequentially reading out the data of the check region in the RS code byte interleaver column-by-column.

Furthermore, the data packet to be RS interleaved encoded is a traffic data packet obtained by encapsulating IP data into a time slicing code flow according to a multiprotocol.

Furthermore, a1, calculating the number of rows M of the byte interleaver based on the number of bytes in the data packet and the number of columns in the information region, and then calculating the number of columns kc in the information region that can be filled up with valid data;

a2, sequentially writing the first kc*M bytes of the data packet into the first kc columns of the information region column-by-column, and moreover writing them in each column in an order from the top down; and a3, filling the remaining bytes of the data packet in the kc-th column evenly and dispersedly, filling 0 in the rest of positions of the column, and moreover filling 0 in the remaining columns of the information region.

Furthermore, a specific operation for the step a3 is g=floor(M/d), h=floor(M/(M−d)), wherein M is the number of rows of the RS code byte interleaver, and floor is a round-down calculation;

If $d \leq M/2$, then sequentially writing the remaining d bytes of the traffic data packet into rows 0, g, 2*g, ..., and (d−1)*g in the kc-th column from in an order from the top down, and filling 0 of (M−d) bytes in the remaining rows; otherwise, filling 0 of (M−d) bytes in rows 0, h,2*h, ..., and (M−d−1)*h in the kc-th column, and sequentially writing the remaining d bytes of the traffic data packet into the remaining rows in an order from the top down.

Furthermore, in the step c, cyclic shifting processing is performed on the data of the check region in a column manner or in a row manner, the number of bits shifted in each column or each row is not entirely the same, and the number of bits shifted in each column or each row is calculated using a predefined formula.

Furthermore, in the step c, cyclic shifting is performed on the data of the check region in a column manner, the number of bits shifted in the i-th column is floor(i*M/S), i=1, ..., S−1, wherein M is the number of rows of the interleaver, and S is the number of columns of the check region.

The present invention also provides a device for interleaved encoding RS code, including: an RS code byte interleaver, a data writing module, an RS encoding module, and a data readout module;

the RS code byte interleaver is used to store data to be interleaved, wherein the number of columns is N, the left K columns are an information region, and the right S columns are a check region;

the data writing module is used to sequentially write data in a data packet to be RS interleaved encoded into the information region of the RS code byte interleaver column-by-column, and to send a signal of writing being completed to the RS encoding module;

the RS encoding module is used to construct data in each row of the check region of the RS code byte interleaver based on the data written into the information region after receiving the signal of writing being completed;

wherein: the device also includes a cyclic shift module;

the RS encoding module is also used to send a signal of encoding being completed to the cyclic shift module upon completion of encoding;

the cyclic shift module is used to perform cyclic shifting processing on the data of the check region in the RS code byte interleaver after receiving the signal of encoding being completed, and to send a signal of cyclic shifting being completed to the data readout module; and the data readout module is used to sequentially read out the data of the check region in the RS code byte interleaver column-by-column after receiving the signal of cyclic shifting being completed.

Furthermore, the device also includes a parameter calculation module, which is used to calculate the number of rows M of the RS code byte interleaver and the number of columns kc in the information region that can be filled up with valid data based on the number of bytes F in the data packet and the number of columns K of the information region and also to calculate d=F mod M; and, if d is not 0, also calculating: g=floor(M/d), h=floor(M/(M−d)), mod being a modulus operation, floor being a round-down calculation; and moreover sending individual parameters thus calculated to the data writing module.

Furthermore, that the data writing module sequentially writes the data in the data packet to be RS interleaved encoded into the information region of the RS code byte interleaver column-by-column means:

the data writing module sequentially writes the first kc*M bytes of the data packet into the first kc columns of the information region of the RS code byte interleaver column-by-column after receiving the individual parameters, and writes in each column in an order from the top down; and evenly and dispersedly fills the remaining d bytes in the data packet into the kc-th column, and fills 0 in the rest of positions of the column, and also fills 0 in the remaining columns of the information region.

Furthermore, that the data writing module evenly and dispersedly fills the remaining d bytes in the data packet into the kc-th column and fills 0 in the rest of positions of the column refers to:

If $d \leq M/2$, then sequentially writing the remaining d bytes of the traffic data packet into rows 0, g, 2*g, ..., and (d−1)*g in the column in an order from the top down, and filling 0 of (M−d) bytes in the remaining rows; otherwise, filling 0 of (M−d) bytes in rows 0, h,2*h, ..., and (M−d−1)*h in the column, and sequentially writing the remaining d bytes of the traffic data packet into the remaining rows in an order from the top down.

Furthermore, that the cyclic shift module is used to perform cyclic shifting processing on the data of the check region in the RS code byte interleaver refers to: performing cyclic shifting on the data of the check region in a column manner or in a row manner, the number of bits shifted in each column or each row being not entirely the same, and the number of bits shifted in each column or each row being calculated using a predefined regulation.

Furthermore, the cyclic shift module performs cyclic shifting on the data of the check region in a column manner, the number of bits shifted in the i-th column is floor(i*M/S), i=1, . . . , S−1, wherein M is the number of rows of the interleaver, S is the number of columns of the check region, and floor is a round-down calculation.

In summary of the above, the present invention provides a device and method for interleaved encoding RS code, performing cyclic shifting in the column direction, ensuring that there is also good diversity effect in the row direction, therefore playing a role of row replacement of the row-column interleaver and thus offering the best performance to the encoding; the present invention also proposes evenly placing and filing 0 in the columns which contain filled bytes and information data packet bytes thereby providing more even protection in terms of time. The advantage of doing so is that the interleaved time diversity effect is better.

DETAILED DESCRIPTION

The present invention provides a device and method for interleaved encoding RS code to improve an RS code interleaved encoding scheme in an existing technology and to achieve the technical result of enhancing reliability of a data link layer by evenly spreading areas with a filled value of 0 in the last column of an information region that is filled with valid information and/or by performing shifting on check data of a check region.

Figure 2:
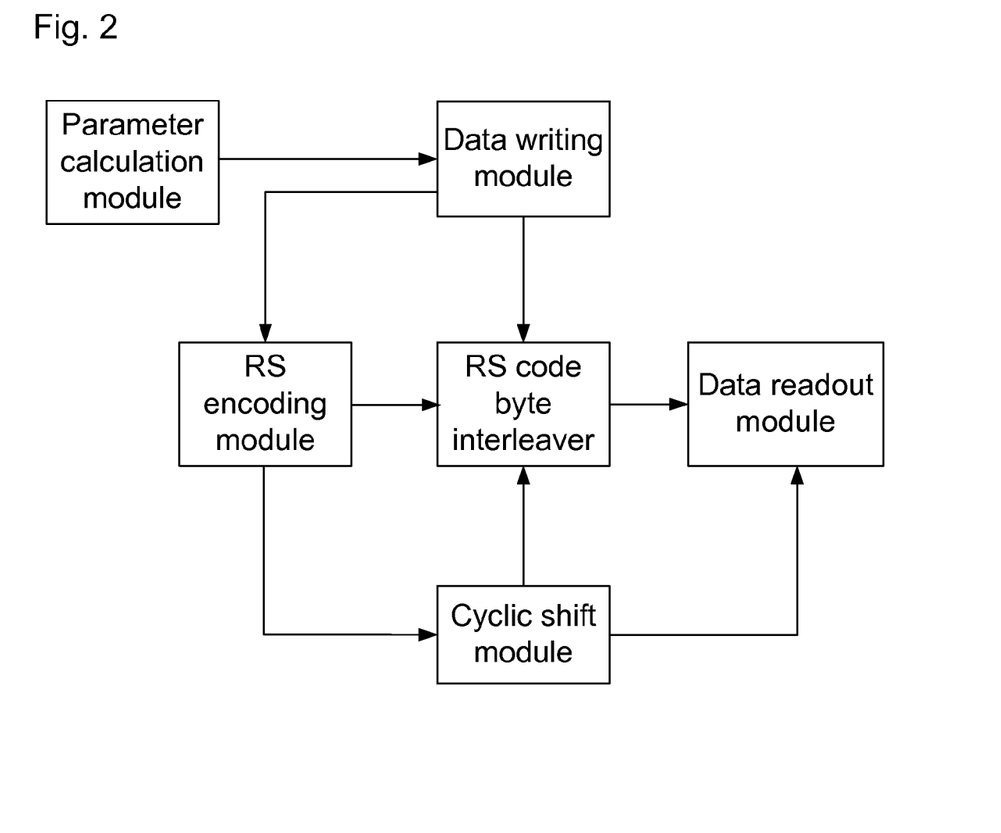
FIG. 2 is a diagram illustrating the structure of the device in an embodiment of the present invention.

This embodiment provides a device for interleaved encoding RS code, as shown in FIG. 2, which includes: an RS code byte interleaver, a parameter calculation module, a data writing module, an RS encoding module, a cyclic shift module and a data readout module; the data writing module is connected with the parameter calculation module and the RS encoding module, the RS code byte interleaver is connected with the data writing module, the RS encoding module, the cyclic shift module and the data readout module altogether, and the cyclic shift module is also connected with the RS encoding module and the data readout module, wherein:

the parameter calculation module is used to receive the number of bytes F in a data packet, to calculate the number of rows M of the RS code byte interleaver based on the number of bytes F and the number of columns K of an information region, to calculate the number of columns kc in the information region that can be filled up with valid data, and to send the calculated parameters to the data writing module. A specific calculation method is described in detail as below.

The RS code byte interleaver is used to store the data to be interleaved, wherein the number of columns is N, the left K columns are the information region, and the right S (S equals N−K) columns are the check region. In this embodiment, the columns and rows in the RS code byte interleaver are numbered from 0, or can be numbered in other manners in a specific embodiment.

The data writing module is used to sequentially write the data in the data packet to be RS interleaved encoded into the information region of the RS code byte interleaver column-by-column after receiving the individual parameters sent by the parameter calculation module, i.e., sequentially writing the first kc*M bytes of the data packet into the first kc columns of the information region of the RS code byte interleaver column-by-column in an order from the top down in each column; and then evenly and dispersedly filling the remaining d bytes in the data packet into the kc-th column, and filling 0 in the rest of positions of the column, and finally filling 0 in the remaining columns of the information region. The data writing module is also used to send a signal of writing being completed to the RS encoding module after completing data writing of the information region.

A specific manner for filling the kc-th column is: If $d \leq M/2$, then sequentially writing the remaining d bytes of the traffic data packet into rows $0, g, 2*g, \ldots,$ and $(d-1)*g$ in the column in an order from the top down, and filling 0 of (M−d) bytes in the remaining row positions; otherwise, filling 0 of (M−d) bytes in rows $0, h, 2*h, \ldots,$ and $(M-d-1)*h$ in the column, and sequentially writing the remaining d bytes of the traffic data packet into the remaining rows in an order from the top down.

Figure 5:
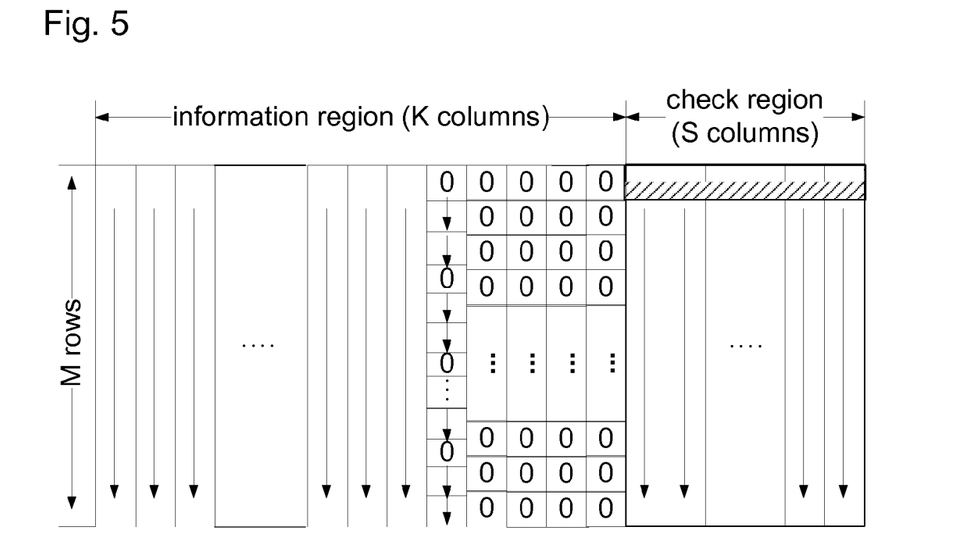
FIG. 5 is a diagram illustrating the method for interleaved encoding RS code in an embodiment of the present invention in which cyclic shifting has not been performed on check data.

The RS encoding module is used to construct data in each row of the check region of the RS code byte interleaver based on the data written into the information region after receiving the signal of writing being completed which is sent by the data writing module, i.e., performing RS encoding by rows, adding check data of S bytes at the end of each row, the check data of each row being generated based on data information of the first K columns in the current row, and the specific method is the same as that in an existing technology, the form after filling data is shown in FIG. 5, which only illustrates that the check data of the 0th row are filled. The RS encoding module is also used to send a signal of encoding being completed to the cyclic shift module upon completion of encoding.

The cyclic shift module is used to perform cyclic shifting processing on the data of the check region in the RS code byte interleaver after receiving the signal of encoding being completed, i.e., performing cyclic shifting on the data of the check region in a column manner or in a row manner, the number of bits shifted in each column or each row is not entirely the same, and the number of bits shifted in each column or each row is calculated using a predefined regulation, such as using a predefined formula. A specific shifting method is described in detail as below.

The cyclic shift module is also used to send a signal of cyclic shifting being completed to the data readout module upon completion of cyclic shifting.

The data readout module is used to sequentially read out the data of the check region in the RS code byte interleaver column-by-column after receiving the signal of cyclic shifting being completed, i.e., reading out the data of each column in an order from the top down.

Figure 3:
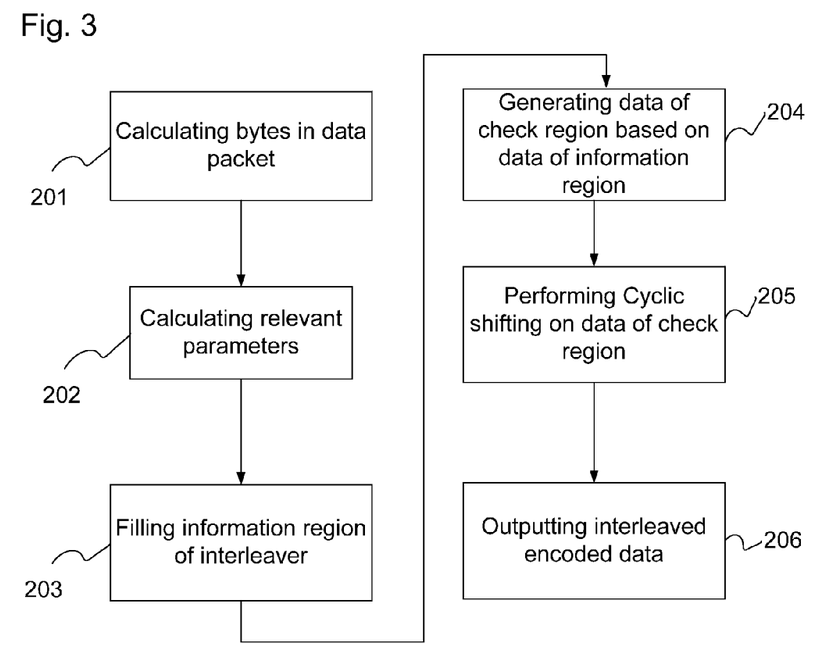
FIG. 3 is a flow chart of the method in an embodiment of the present invention.
Figure 4:
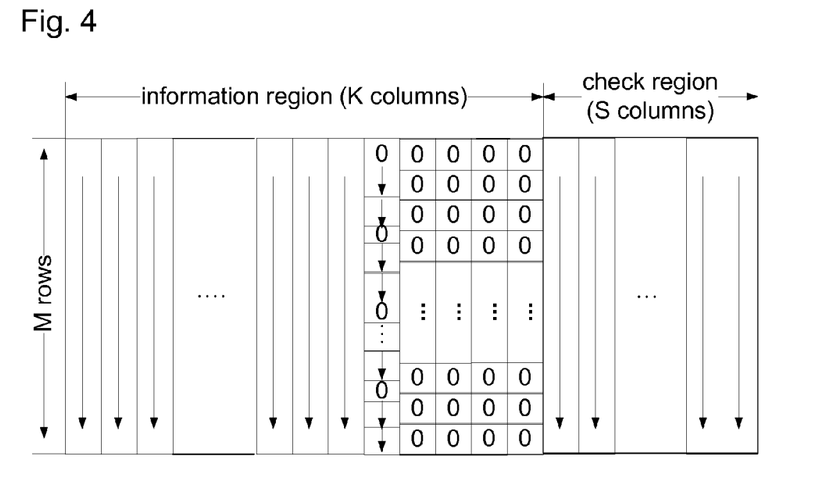
FIG. 4 is a diagram illustrating the method for interleaved encoding RS code in an embodiment of the present invention in which filled portions are performed interleaving.

This embodiment has also provided a method for interleaved encoding RS code, assuming the given RS code being (N, K, S), then the number of columns of the corresponding byte interleaver is N, the left K columns are an information region, and the right S (S equals N−K) columns are an check region. In this embodiment, the columns or rows in the interleaver are numbered from 0, or can also be numbered in other manners in a specific embodiment. As shown in FIG. 3, specific operations of the method in the present invention are described below:

Step 201: obtaining the number of bytes in a traffic data packet by encapsulating IP data into a TS (Time-slicing) code flow according to a multiprotocol, assuming the number of bytes of the data packet being F bytes, and the specific operation method for this step is identical to that in an existing technology;

Step 202: calculating the number of rows M of the RS code byte interleaver and the number of columns kc in the information region that can be filled up with valid data based on the number of bytes F in the traffic data packet and the number of columns K of the information region, wherein the columns filled up with valid data mean those columns that can be filled up directly with the data in the original data packet;

the number of rows in the interleaver is M=ceil(F/K), ceil means rounding-up;

kc=floor(F/M), floor means rounding-down; then calculating the following parameters:

d=F mod M, mod means a modulus operation; d means the number of remaining bytes after filling up the first kc columns; if d is not 0, then performing the following calculation:

g=floor(M/d), floor means rounding-down;

h=floor(M/(M−d)), floor means rounding-down;

Step 203: firstly, filling in the first K columns, i.e., the information region, of the RS (N, K, S) code byte interleaver with the data of the traffic data packet based on the parameters calculated above:

the step can be divided into the following substeps:

Step 2031: sequentially writing the first kc*M bytes of the traffic data packet into the first kc columns (i.e., from the 0th column to the (kc−1)th column) of the information region column-by-column, moreover, sequentially writing them in each column in an order from the top down, i.e., first, filling the 0th column of the RS (N, K, S) code byte interleaver in an order from the top down, then filling the 1st column in an order from the top down, and so on, until completing filling up the first kc columns of the RS (N, K, S) code byte interleaver and moreover filling each column with M bytes. If d is not 0, then Step 2032 is executed; otherwise Step 204 is executed;

Step 2032: Evenly and dispersedly filling the remaining d bytes in the data packet into the kc-th column and filling 0 in the rest of positions of the column, the specific filling method can be but is not limited to: if d≦M/2, then sequentially writing the remaining d bytes of the traffic data packet into rows 0, g, 2*g, . . . , and (d−1)*g in the column in an order from the top down, and filling 0 of M−d bytes in the remaining rows; otherwise, filling 0 of M−d bytes in rows 0, h, 2*h, . . . , and (M−d−1)*h in the column, and sequentially writing the remaining d bytes of the traffic data packet into the remaining rows in an order from the top down. The form after filling bytes is shown in FIG. 4, at which time the bits filled in the columns mixed with both information data and filled data are almost evenly distributed in the last column. Then Step 2033 is executed;

Step 2033: filling 0 in the remaining portions of the information region, i.e., filling 0 in columns from the (kc+1)th column to the (K−1)th column altogether.

Step 204: constructing data of the check region in each row based on the data in the information region, i.e., performing RS encoding by rows, adding check data of S bytes at the end of each row, the check data of each row being generated based on the data information of the first K columns in the current row, and the specific method is the same as that in an existing technology, the form after filling data is shown in FIG. 5, which only illustrates that the check data of the 0th row are filled;

Step 205: performing cyclic shifting processing on the check data in the RS code byte interleaver, which can be either cyclic shifting by rows or cyclic shifting in a column manner, the number of bits shifted in each column or each row is not entirely the same, and the number of bits shifted in each column or each row is calculated using a predefined regulation, such as using a predefined formula. A specific shifting method can be but is not limited to any of the following methods:

not performing a column cyclic shift operation on the data of all rows in the 0th column;

for the data of all rows in the i-th column, performing cyclic shifting in an direction from the top down, and the number of bits shifted for all data in the same column being the same. The formula for calculating the number of bits shifted can be but is not limited to: floor(i*M/S) bit, i=1, . . . , S−1.

Step 206: sequentially reading out the data of the check region in the RS code byte interleaver column-by-column in an order from the top down in each column, and performing XPE-FEC multiplex adaptive encapsulation.

An application example is used below to further describe the method in the present invention:

The interleaved encoding method for RS (255, 207, 48) code is taken as an example to specifically describe the method for interleaved encoding RS code as proposed in the present invention.

For the RS (255, 207, 48) code, its information symbol sequence contains 207 bytes, 48 check bytes are generated after encoding, and therefore the code word length is a total of 255 bytes. Thus, the RS code byte interleaver is fixed to have 255 columns, as shown in FIG. 4, wherein the 207 columns on the left side are the information region and the 48 columns on the right side are the check region.

Firstly, encapsulating IP data into a TS (Time-slicing) code flow according to a multiprotocol, assuming that the number of the traffic data packet encapsulated being 9600 bytes, and the method of performing RS (255, 207, 48) code interleaved encoding on the data packet is as below:

Step 301: calculating relevant parameters:

the number of rows in the interleaver is M=ceil(9600/207)= 47, ceil means rounding-up;

d=F mod M=9600 mod 47=12, mod means an modulus operation;

kc=floor(F/M)=floor(9600/47)=204, floor means rounding-down; and g=floor(M/d)=floor(47/12)=3, floor means rounding-down.

Step 302: filling in the first 207 columns, i.e., the information region, of the RS (255, 207, 48) code byte interleaver with the data of the traffic data packet based on the parameters calculated above:

Step 3021: sequentially writing the first kc*M bytes, i.e., 204*47=9588 bytes, of the traffic data packet into the first 204 columns (i.e., from the 0th column to the 203rd column) of the information region column-by-column in an order from the top down in each column, and filling 47 bytes in each column;

Step 3022: filling the remaining 12 bytes in the data packet into the 204th column, d=12, M/2=47/2, so d≦M/2, therefore filling data of d=12 bytes in rows 0, g, 2*g, . . . , and (d−1)*g (i.e., rows 0, 3, 2*3, . . . , and 11*3) in the column, writing 0 of the remaining M−d=35 bytes into the remaining rows in the column in an order from top down, and filling 0 in all rows of the last 2 columns (i.e., the 205th and 206th columns) in the information region, as shown in FIG. 4.

Step 303: performing RS encoding by rows, adding check data of 48 bytes at the end of each row, and the specific filling method is the same as that in an existing technology.

Figure 6:
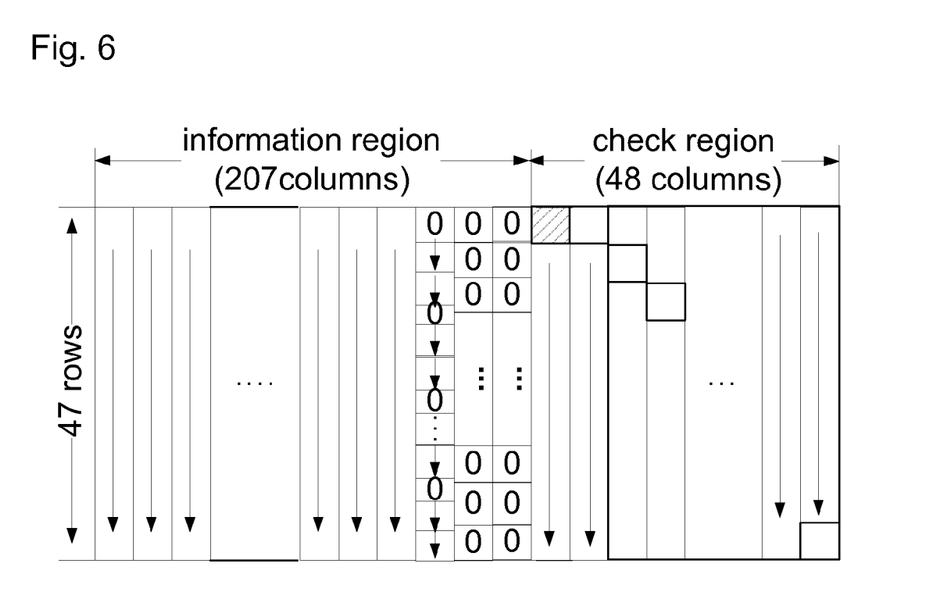
FIG. 6 is a diagram illustrating the method for interleaved encoding RS code in an embodiment of the present invention in which cyclic shifting has been performed on check data.

Step 304: performing cyclic shifting processing on the data of the check region in the RS code byte interleaver, as defined below:

not performing a column cyclic shift operation on the 0th column;

for the i-th column, cyclically shifting floor(i*M/S) bits in an direction from the top down, i=1, . . . , S−1.

specifically, for the 1st column, cyclically shifting floor(1*47/48)=0, i.e., shifting no data in the column;

for the 2nd column, cyclically shifting floor(2*47/48)=1, i.e., shifting all data in the column downward by 1 bit, and the data that are located in the 46th row originally now being located in the 0th row of the column after shifting;

for the 3rd column, cyclically shifting floor(3*47/48)=2, i.e., shifting all data in the column downward by 2 bits, and the data that are located in the 45th and 46th rows originally now being located in the 0th and 1st rows of the column respectively after shifting; and so on, for the 47th column, cyclically shifting floor(47*47/48)= 46, i.e., shifting all data in the column downward by 46 bits; a diagram illustrating the RS code byte interleaver after cyclic shifting is as shown in FIG. 6, which only illustrates the check data in the 0th row after cyclic shifting.

Step 305: sequentially reading out the data of the check region in the RS code byte interleaver column-by-column in an order from the top down in each column, and performing XPE-FEC multiplex adaptive encapsulation.

In summary of the above, the present invention provides a large time span and good diversity effect during data output of the region after performing cyclic shifting processing on the data of the check region, thereby improving the performance of the entire data packet outputted and further enhancing the reliability of the data link layer.

INDUSTRIAL APPLICABILITY

The technical scheme of the present invention can be adopted to improve the performance of the entire data packet outputted, thereby enhancing the reliability of a data link layer, by evenly spreading areas with a filled value of 0 in the last column of an information region that is filled with valid information and by performing cyclic shifting processing on data of a check region so that a larger time span and good diversity effect are offered to the data of the region when outputted.

What is claimed is:

1. A method for interleaved encoding Reed-Solomon (RS) code, setting the RS code used to be RS (N, K, S), including the following steps:

a, sequentially writing data in an data packet to be RS interleaved encoded into an information region of an RS code byte interleaver column-by-column;

b, constructing data of each row of a check region based on the data written into the information region; and c, performing cyclic shifting processing on the data of the check region, and sequentially reading out the data of the check region in the RS code byte interleaver column-by-column;

wherein N is a number of columns of the RS code byte interleaver, left K columns of which are the information region, and right S columns of which are the check region, and S=N−K.

2. The method according to claim 1, wherein:

the data packet to be RS interleaved encoded is a traffic data packet obtained by encapsulating IP data into a time slicing code flow according to a multiprotocol.

3. The method according to claim 1, wherein the step a comprises:

a1, calculating the number of rows M of the byte interleaver based on the number of bytes in the data packet and the number of columns in the information region, and then calculating the number of columns kc in the information region that can be filled up with valid data;

a2, sequentially writing the first kc*M bytes of the data packet into the first kc columns of the information region column-by-column in an order from the top down in each column; and a3, filling the remaining bytes of the data packet in the kc-th column evenly and dispersedly, filling 0 in the rest of positions of the column, and filling 0 in the remaining columns of the information region.

4. The method according to claim 3, wherein the step a3 comprises: let g=floor(M/d), h=floor(M/(M−d)), where M is the number of rows of the RS code byte interleaver, and floor is a round-down calculation;

If d≦M/2, then sequentially writing the remaining d bytes of the traffic data packet into rows 0, g, 2*g, . . . , and (d−1)*g in the kc-th column in an order from the top down, and filling 0 of (M−d) bytes in the remaining rows; otherwise, filling 0 of (M−d) bytes in rows 0, h,2*h, . . . , and (M−d−1)*h in the kc-th column, and sequentially writing the remaining d bytes of the traffic data packet into the remaining rows in an order from the top down.

5. The method according to claim 1, wherein:

in the step c, the cyclic shifting processing is performed on the data of the check region in a column manner or in a row manner, the number of bits shifted in each column or each row is not entirely the same, and the number of bits shifted in each column or each row is calculated using a predefined formula.

6. The method according to claim 5, wherein:

in the step c, the cyclic shifting is performed on the data of the check region in a column manner, the number of bits shifted in the i-th column is floor(i*M/S), i=1, . . . , S−1, where M is the number of rows of the interleaver, and S is the number of columns of the check region.

7. A device for interleaved encoding Reed-Solomon (RS) code including: an RS code byte interleaver, a data writing module, an RS encoding module, and a data readout module;

the RS code byte interleaver being used to store data to be interleaved, the number of columns being N, the left K columns being an information region, and the right S columns being a check region;

the data writing module being used to sequentially write data in a data packet to be RS interleaved encoded into the information region of the RS code byte interleaver column-by-column, and to send a signal of writing being completed to the RS encoding module;

the RS encoding module being used to construct data in each row of the check region of the RS code byte interleaver based on the data written into the information region after receiving the signal of writing being completed;

the device further including a cyclic shift module;

the RS encoding module being also used to send a signal of encoding being completed to the cyclic shift module upon completion of encoding;

the cyclic shift module being used to perform cyclic shifting processing on the data of the check region in the RS code byte interleaver after receiving the signal of encoding being completed, and to send a signal of cyclic shifting being completed to the data readout module; and the data readout module being used to sequentially read out the data of the check region in the RS code byte interleaver column-by-column after receiving the signal of cyclic shifting being completed.

8. The device according to claim 7, further including: a parameter calculation module which is used to calculate the number of rows M of the RS code byte interleaver and the number of columns kc in the information region that can be filled up with valid data based on the number of bytes F in the data packet and the number of columns K of the information region and also to calculate d=F mod M; and, if d is not 0, also calculating: g=floor(M/d), h=floor(M/(M−d)), mod being a modulus operation, floor being a round-down calculation; and sending individual parameters thus calculated to the data writing module.

9. The device according to claim 8, wherein:

the data writing module evenly and dispersedly filling data of the remaining d bytes in the data packet into the kc-th column and filling 0 in the rest of positions of the column refers to:

If d≦M/2, then sequentially writing the remaining d bytes of the traffic data packet into rows 0, g, 2*g, . . . , and (d−1)*g in the column from in an order from the top down, and filling 0 of (M−d) bytes in remaining rows; otherwise, filling 0 of (M−d) bytes in rows 0, h,2*h, . . . , and (M−d−1)*h in the column, and sequentially writing the remaining d bytes of the traffic data packet into the remaining rows in an order from the top down.

10. The device according to claim 7, wherein:

the data writing module sequentially writing the data in the data packet to be RS interleaved encoded into the information region of the RS code byte interleaver column by column refers to:

the data writing module sequentially writing the first kc*M bytes of the data packet into the first kc columns of the information region of the RS code byte interleaver column-by-column after receiving the individual parameters, and moreover writes the bytes in each column in an order from the top down; and evenly and dispersedly filling the remaining d bytes in the data packet into the kc-th column, and filling 0 in the rest of positions of the column, and filling 0 in the remaining columns of the information region.

11. The device according to claim 10, wherein:

the data writing module evenly and dispersedly filling data of the remaining d bytes in the data packet into the kc-th column and filling 0 in the rest of positions of the column refers to:

If d≦M/2, then sequentially writing the remaining d bytes of the traffic data packet into rows 0, g, 2*g, . . . , and (d−1)*g in the column in an order from the top down, and filling 0 of (M−d) bytes in remaining rows; otherwise, filling 0 of (M−d) bytes in rows 0, h,2*h, . . . , and (M−d−1)*h in the column, and sequentially writing the remaining d bytes of the traffic data packet into the remaining rows from in an order from the top down.

12. The device according to claim 7, wherein:

the cyclic shift module being used to perform cyclic shifting processing on the data of the check region in the RS code byte interleaver refers to: performing cyclic shifting on the data of the check region in a column manner or in a row manner, where the number of bits shifted in each column or each row is not entirely the same, and the number of bits shifted in each column or each row is calculated using a predefined regulation.

13. The device according to claim 12, wherein:

the cyclic shift module performs cyclic shifting on the data of the check region in a column manner, the number of bits shifted in the i-th column is floor(i*M/S), i=1, . . . , S−1, where M is the number of rows of the interleaver, S is the number of columns of the check region, and floor is a round-down calculation.

* * * * *